United States Patent
Hirata et al.

(10) Patent No.: US 8,400,148 B2
(45) Date of Patent: Mar. 19, 2013

(54) MAGNETIC RESONANCE IMAGING APPARATUS

(75) Inventors: Satoshi Hirata, Kodaira (JP); Hisaaki Ochi, Kodaira (JP)

(73) Assignee: Hitachi Medical Corporation, Tokyo (JP)

( * ) Notice: Subject to any disclaimer, the term of this patent is extended or adjusted under 35 U.S.C. 154(b) by 844 days.

(21) Appl. No.: 12/307,809

(22) PCT Filed: Dec. 20, 2006

(86) PCT No.: PCT/JP2006/325416
§ 371 (c)(1),
(2), (4) Date: Sep. 24, 2009

(87) PCT Pub. No.: WO2008/004324
PCT Pub. Date: Jan. 10, 2008

(65) Prior Publication Data
US 2010/0026296 A1    Feb. 4, 2010

(30) Foreign Application Priority Data
Jul. 7, 2006 (JP) ................................. 2006-187463

(51) Int. Cl.
*G01V 3/00* (2006.01)
(52) U.S. Cl. ........................................ 324/307; 324/309
(58) Field of Classification Search .................. 324/307, 324/309, 313, 314
See application file for complete search history.

(56) References Cited

U.S. PATENT DOCUMENTS

| | | | | |
|---|---|---|---|---|
| 4,885,542 A | * | 12/1989 | Yao et al. | 324/313 |
| 6,472,872 B1 | * | 10/2002 | Jack et al. | 324/309 |
| 7,218,110 B2 | * | 5/2007 | Zhang et al. | 324/309 |
| 7,518,362 B2 | * | 4/2009 | Hirata et al. | 324/307 |
| 2002/0145424 A1 | | 10/2002 | Uetake et al. | |
| 2006/0255802 A1 | | 11/2006 | Hirata et al. | |
| 2007/0241754 A1 | | 10/2007 | Hirata et al. | |

FOREIGN PATENT DOCUMENTS

| | | |
|---|---|---|
| JP | 63-230156 | 9/1988 |
| JP | 04-102442 | 4/1992 |
| JP | 2004-254884 | 9/2004 |
| WO | WO 2005/000116 A1 | 1/2005 |
| WO | WO 2006/040866 A1 | 4/2006 |

* cited by examiner

*Primary Examiner* — Louis Arana

(74) *Attorney, Agent, or Firm* — Antonelli, Terry, Stout & Kraus, LLP.

(57) ABSTRACT

Magnetic resonance imaging apparatus enabling highly precise spectrum measurement even when resonance frequency changes during MRS or MRSI measurement. When a pulse sequence for suppressing water signals, and an MRS or MRSI pulse sequence are sequentially executed to carry out measurement using repetitive measurement for signal integration or repetitive measurement for phase encoding, signal Sig0 from water is measured with the pulse sequence for suppressing water signals in every repetitive measurement. When the resonance frequency of water deviates from an excitation band region, nuclear magnetization included in water molecules is not excited, so that water signal strength deceases, and therefore change of static magnetic field intensity can be detected by monitoring change of signal Sig0. When water signal strength decreases below a predetermined value, it is determined that resonance frequency has shifted, preliminary measurement for detecting water resonance frequency is performed, and various frequencies are corrected during the repetitive measurement.

13 Claims, 7 Drawing Sheets

MAGNETIC RESONANCE IMAGING APPARATUS

TECHNICAL FIELD

The present invention relates to a magnetic resonance imaging apparatus, in particular, such an apparatus suitable for measurement of magnetic resonance signals including information concerning chemical shifts.

BACKGROUND ART

Magnetic resonance imaging apparatuses irradiate a radio frequency magnetic field of a specific frequency to a subject placed in a static magnetic field to excite nuclear magnetization of hydrogen nuclei contained in the subject (nuclear magnetic resonance phenomenon) and detect nuclear magnetic resonance signals generated by the subject to make it possible to obtain physical and chemical information. In the magnetic resonance imaging (henceforth abbreviated as MRI) currently widely spreading, images reflecting density distribution of hydrogen nuclei mainly contained in water molecules of a subject are obtained.

In contrast to such MRI, the method called magnetic resonance spectroscopy (henceforth abbreviated as MRS) enables to obtain spectra in which nuclear magnetic resonance signals acquired from a desired region (voxel) are separated for every molecular type on the basis of differences in resonance frequencies occurring due to differences of chemical bonds in various molecules containing hydrogen nuclei (henceforth called chemical shifts).

Further, whereas spectra are obtained for one region in MRS, the method of simultaneously obtaining spectra for many regions (pixels) to image for every molecular type is called magnetic resonance spectroscopic imaging (henceforth abbreviated as MRSI), and by using this MRSI, it becomes possible to visually catch concentration distributions of every metabolite (molecule) type contained in the living body.

When a living body is used as a measurement object of the aforementioned MRS or MRSI, concentrations of metabolites are usually extremely low in many cases, and therefore if the MRS or MRSI measurement is performed without suppressing signals of water of high concentration, weak signals of metabolites are hidden in the foot of the huge signal peak generated by water, and it will become extremely difficult to separate and extract signals of metabolites. For this reason, a pretreatment for suppressing water signals is conventionally performed immediately before performing excitation and detection with an MRS or MRSI measurement sequence.

In the treatment for suppressing water signals, in order to excite nuclear magnetization included in only water molecules, a radio frequency magnetic field is irradiated first, wherein the transmission frequency of the radio frequency magnetic field is adjusted to the water peak position, and the excitation frequency band thereof is narrowed to a level around the water peak width. Then, in order to separate phases of the nuclear magnetization in a large number of water molecules in an excited state and to make the vectorial sum of nuclear magnetization zero, a dephasing magnetic field gradient is applied (pseudo saturation). While the pseudo saturation of water magnetization continues, excitation and detection are performed with an MRS or MRSI measurement sequence to measure weak signals of metabolites. Further, since the signals of metabolites are very weak, integration is often performed many times in the conventional MRS or MRSI measurement in order to improve the signal-to-noise ratio (S/N). Moreover, in the MRSI measurement, in order to impart positional information, it is necessary to repeat the measurement according to the number of pixels to be measured with changing stepwise application intensity of the phase encoding magnetic field gradient.

DISCLOSURE OF THE INVENTION

Object to be Achieved by the Invention

In a magnetic resonance imaging apparatus, resonance frequency of each nuclear spin is determined by static magnetic field intensity. Therefore, before the MRS or MRSI measurement mentioned above, spectrum measurement is performed at least once without suppressing water signals (pre-measurement for resonance frequency detection) to detect the resonance frequency of water, and on the basis of the detected resonance frequency, the transmission frequency at the time of radio frequency magnetic field irradiation and the reception frequency at the time of magnetic resonance signal detection are determined to be certain constant frequencies.

However, depending on the structure and characteristics of the magnet which generates the static magnetic field, and the measurement environment, static magnetic field intensity may change during the MRS or MRSI measurement. In such a case, various problems arise in the MRS or MRSI measurement. For example, even if measurement is repeated for the integration or phase encoding, with shift of the resonance frequency, suppression rate of water may gradually fall, excitation slice position may gradually shift, the S/N improvement effect based on the integration may not be sufficiently obtained, and positional information cannot be correctly imparted by the phase encoding.

As for change of the resonance frequency in association with change of the static magnetic field, there have been proposed a method of calculating the change by measuring resonance frequency at two or more time points and correcting phase errors and so forth accompanying measurement of chemical shift images (Patent document 1) and a method of measuring change of resonance frequency in MRI and performing a correction operation when the change is larger than a threshold value (Patent document 2).

Patent document 1: Japanese Patent Unexamined Publication (KOKAI) No. 63-230156
Patent document 2: Japanese Patent Unexamined Publication No. 2002-291718

However, the technique of Patent document 1 uses a value predicted from frequency change characteristics measured beforehand before performing the MRSI measurement, and therefore, if an unpredictable sharp frequency change arises, sufficient correction effect cannot be obtained. Further, the technique of Patent document 2 requires a long signal measuring time for directly measuring the resonance frequency for every MRI measurement, and therefore it has a problem that the repetition time TR for the measurement becomes longer.

An object of the present invention is to provide a magnetic resonance imaging apparatus which enables highly precise MRS or MRSI measurement by highly precisely suppressing water signals even when resonance frequency changes during the measurement.

Means for Achieving the Object

The magnetic resonance imaging apparatus of the present invention which achieves the aforementioned object obtains signals by using a pulse sequence for suppressing water signals, determines frequency change from the information, performs highly precise water signal suppression, and improves precision of the spectrometry in the following MRS, MRSI or the like.

That is, the magnetic resonance imaging apparatus of the present invention comprises a static magnetic field magnet which generates a static magnetic field, a magnetic field gradient generating means which generates a magnetic field gradient, a radio frequency magnetic field generating means which generates a radio frequency magnetic field, a receiving means which receives nuclear magnetic resonance signals generated by a subject, a control means which controls the magnetic field gradient generating means, the radio frequency magnetic field generating means and the receiving means, and a means which calculates a spectrum of an imaging area of the subject by using the nuclear magnetic resonance signals, wherein the control means includes at least one first pulse sequence for applying a radio frequency magnetic field of a first frequency for suppressing magnetization of a specific substance contained in the imaging area, and a second pulse sequence for applying a radio frequency magnetic field of a second frequency following the first pulse sequence to obtain nuclear magnetic resonance signals from the imaging area, performs control for obtaining the nuclear magnetic resonance signals after application of the radio frequency magnetic field of the first frequency with the first pulse sequence, and comprises a means for determining change of the first frequency by using information of the nuclear magnetic resonance signals obtained with the first pulse sequence.

The magnetic resonance imaging apparatus of the present invention comprises a memory means which memorizes information of the nuclear magnetic resonance signals obtained with the first pulse sequence, and the control means repeatedly executes the first pulse sequence and the second pulse sequence, and saves information of the nuclear magnetic resonance signals obtained with the first pulse sequence in the memory means for every repetition.

In the magnetic resonance imaging apparatus of the present invention, the information of the nuclear magnetic resonance signal utilized by the determination means is, for example, intensity or change of intensity of the nuclear magnetic resonance signals, and when intensity of the nuclear magnetic resonance signals is lower than a preliminarily determined threshold value, or when change of the intensity is larger than a preliminarily determined threshold value, the determination means determines that there is change of the frequency.

The first pulse sequence includes application of the radio frequency magnetic field of the first frequency and subsequent application of a dephasing magnetic field gradient, and nuclear magnetic resonance signals are obtained between the application of the radio frequency magnetic field and the application of the magnetic field gradient. The first pulse sequence may include multiple times of repetition of the application of the radio frequency magnetic field and the subsequent application of the dephasing magnetic field gradient, and in such a case, the nuclear magnetic resonance signals are preferably obtained immediately after the first application of the radio frequency magnetic field.

In the magnetic resonance imaging apparatus of the present invention, the control means further comprises a third pulse sequence for measuring a spectrum for determining the first frequency, the third pulse sequence is executed when it is determined by the determination means that there is change of the frequency, and the first frequency is thereby determined. On the basis of the first frequency determined from the spectrum measured with the third pulse sequence, frequencies of the radio frequency magnetic fields of the first and second pulse sequences executed after the third pulse sequence are set.

In the magnetic resonance imaging apparatus of the present invention, the second pulse sequence is an MRSI pulse sequence or an MRS pulse sequence. For example, it is an MRSI pulse sequence including at least one application of the radio frequency magnetic field of the second frequency and application of a phase encoding magnetic field gradient, which are repeatedly executed with changing the phase encoding magnetic field gradient. Alternatively, it is an MRS pulse sequence including at least three applications of the radio frequency magnetic field of the second frequency and application of a slice selection magnetic field gradient for each application of the radio frequency magnetic field with a different slice direction, for measuring nuclear magnetic resonance signals of a region at which the three different slice directions cross.

Effect of the Invention

According to the present invention, frequency change can be promptly detected without extending the measurement time by measuring signals with a water signal suppression pulse sequence before MRSI or MRS and determining frequency change from the signals. Change of the resonance frequency during the measurement can be thereby quickly coped with, thus various problems such as decline in the water suppression rate, deviation of excitation slice position, reduction of the S/N improvement effect and shift of the impartation of the positional information by phase encoding can be reduced, and highly precise spectrum measurement is enabled.

BEST MODE FOR CARRYING OUT THE INVENTION

Hereafter, embodiments of the present invention will be explained with reference to the drawings.

FIG. 1 includes exterior views of magnetic resonance imaging apparatuses to which the present invention is applied. FIG. 1, (a) shows a magnetic resonance imaging apparatus using a tunnel type magnet which generates a static magnetic field with a solenoid coil, and FIG. 1, (b) shows a hamburger type magnetic resonance imaging apparatus in which the magnet is separated up and down in order to enhance open feeling. FIG. 1, (c) also shows a tunnel type magnetic resonance imaging apparatus like FIG. 1, (a), in which depth of the magnet is shortened and leaned aslant to increase open feeling. The present invention is applicable to any apparatus regardless of shape and type of the magnet, as exemplified in FIG. 1.

Configuration of a magnetic resonance imaging apparatus according to an embodiment of the present invention will be explained below with reference to FIGS. 2 and 3. As shown in FIG. 2, the magnetic resonance imaging apparatus of this embodiment principally consists of an image pick-up part 10 and a control part 20, if it is roughly divided. Configuration of the image pick-up part 10 is the same as that of conventional common magnetic resonance imaging apparatuses, and the characteristic of the magnetic resonance imaging apparatus of the present invention resides in the control part 20.

The image pick-up part 10 is mainly constituted by, as shown in FIG. 3, a static magnetic field generating magnet 12 which generates a static magnetic field in a space in which a subject 15 is placed, a shim coil 11 for adjusting homogeneity of the static magnetic field, a magnetic field gradient generating coil 13 which imparts magnetic field gradient along three orthogonal directions to the static magnetic field, a probe 14 which irradiates a radio frequency magnetic field on the subject 15 to induce nuclear magnetic resonance phenomenon and receives nuclear magnetic resonance signals generated by the subject 15, a power supplying part 16 for shim coil, a power supplying part 17 for magnetic field gradient, a transmitter 18, a receiver 19, and so forth. Although FIG. 3 shows an example in which the probe 14 is used for both transmission and reception, a probe for transmission and a probe for reception may be separately provided.

The transmitter 18 generates a radio frequency magnetic field to be irradiated on the subject 15. The transmitter 18 is provided with an oscillator not shown, of which oscillating frequency can be changed according to resonance frequency of an object to be examined. The frequency of the oscillator is also used as a reference frequency used by the receiver 19 at the time of detecting nuclear magnetic resonance signals.

The power supplying part 16 for driving the shim coil 11, the power supplying part 17 for driving the magnetic field gradient generating coil 13, the transmitter 18 and the receiver 19 are controlled by the sequence control part 21 of a control and operation part 20. The sequence control part 21 of the control and operation part 20 controls the power supplying part 17 for driving, the transmitter 18 and the receiver 19 according to a predetermined pulse sequence, a radio frequency magnetic field and a magnetic field gradient are thereby applied to a subject 1 (or a space in which the subject 1 is placed) at predetermined timing and intensity, and the nuclear magnetic resonance signals generated by the subject 1 are thereby received by the receiver 19 to pick up images. The pulse sequence is incorporated into the sequence control part 21 beforehand as a program. There are various pulse sequences corresponding to various imaging methods, and the magnetic resonance imaging apparatus of this embodiment comprises various pulse sequences suitable for MRS, MRSI, and so forth.

The control part 20 is provided with, besides the sequence control part 21 mentioned above, a computer (spectrum calculation part) 22 for performing various operations of nuclear magnetic resonance signals received by the receiver 19 such as Fourier transform and correction processing to create spectra, spectrum images and so forth, a determination part 23 for determining frequency change, and a main control part 25. It is also provided with a memory part 30 which memorizes parameters required for operations and controls performed by the control part 20, measurement conditions and so forth, a display 40 for displaying spectrum information and image information generated by the computer 22, an input device 50 for a user to input commands into the control part 20, and so forth. The memory part 30 comprises a main measurement signal storage part 31 which memorizes signals obtained by main measurement (spectrum information), a parameter-and-so-forth storage part 32 which memorizes parameters and so forth, a signal information storage part 33 which memorizes signal intensity information, and so forth. These functions of the control parts 20 will be explained in detail below together with the operation of the magnetic resonance imaging apparatus.

Operation of the magnetic resonance imaging apparatus of this embodiment will be explained below by exemplifying MRS with reference to FIGS. 4 to 7. FIG. 4 is a flowchart showing operation of the magnetic resonance imaging apparatus of this embodiment, FIG. 5 shows an example of a pulse sequence for MRS, FIG. 6 shows an example of pulse sequence for suppressing water signal (water signal suppressing pulse sequence) to be executed prior to the MRS measurement, and FIG. 7 shows processing steps performed by the image pick-up part 10 and the control part 20 in time series.

As shown in FIG. 4, a voxel to be imaged is first determined in the MRS measurement (step 401). In the determination of the imaging voxel, for example, a voxel position is specified by using a positioning image obtained by low space resolution or the like before the measurement to set axis and intensity of a magnetic field gradient for choosing the voxel. Further, imaging parameters (flip angle of the radio frequency magnetic field, echo time, repetition time) and so forth are also set up. Then, shimming is performed if needed, and the shim coil 11 and so forth are adjusted to improve homogeneity of the static magnetic field (step 402).

After such preparative steps are finished, preliminary measurement is performed. In the preliminary measurement, the same MRS pulse sequence as that of the main measurement is executed without executing the water signal suppressing pulse sequence (step 403), signals are measured from the voxel selectively excited, spectrum thereof is calculated (step 404), and the resonance frequency Fw and peak ΔFw of water are calculated (step 405). The resonance frequency Fw and the peak ΔFw are set as the transmission frequency Ft and excitation frequency band ΔFt used for the water signal suppression pulse sequence (step 406). Then, the main measurement is started. In the main measurement, signals are measured under water signal suppression. That is, a water signal suppression pulse sequence and a pulse sequence for MRS are executed (step 407).

As the pulse sequence for MRS, a known MRS pulse sequence such as shown in FIG. 5 is used. That is, a first magnetic field gradient Gs1 (magnetic field gradient of the X-axis direction) for selection of the first slice (plane perpendicular to the X-axis) and a first radio frequency magnetic field RF1 called 90° pulse are simultaneously applied to excite nuclear magnetization in the first slice. Here, echo time is represented by TE, and repetition time is represented by TR.

Then, after TE/4 from the irradiation of RF1, a second magnetic field gradient (magnetic field gradient of the Y-axis direction) Gs2 for selection of the second slice (plane perpendicular to the Y-axis) and a second radio frequency magnetic field RF2 called 180° pulse are simultaneously applied to reverse the nuclear magnetization in the first slice excited by RF1 also included in the second slice by 180°.

Further, after TE/2 from the irradiation of RF2, a third magnetic field gradient (magnetic field gradient of the Z-axis direction) Gs3 for selection of the third slice (plane perpendicular to the Z-axis) and a third radio frequency magnetic field RF3 called 180° pulse are simultaneously applied to reverse again the nuclear magnetization reversed by RF2 in the crossing region of the first slice and the second slice and also included in the third slice by 180°. By applying the aforementioned three sets of radio frequency magnetic fields and magnetic field gradients, a magnetic resonance echo signal Sig1 of which echo time corresponds to the time point after TE/4 from the irradiation of RF3 is generated.

Gs1' applied immediately after the application of Gs1 is a rephasing (phase returning) magnetic field gradient for Gs1. Gd1 and Gd1', Gd2 and Gd2', and Gd3 and Gd3' to be applied before and after the application of RF2 are dephasing magnetic field gradients (phase disturbance) of the nuclear magnetization excited by the irradiation of RF2, without disturbing the phase of the nuclear magnetization excited by the irradiation of RF1. Furthermore, Gd4 and Gd4', Gd5 and Gd5', and Gd6 and Gd6' to be applied before and after the application of RF3 are dephasing magnetic field gradients (phase disturbance) of the nuclear magnetization excited by the irradiation of RF3, without disturbing the phase of the nuclear magnetization excited by the irradiation of RF1.

By executing the pulse sequence of FIG. 5, only the nuclear magnetization included in the region (imaging voxel) V1 at which three of the aforementioned slices cross can be selectively excited. Further, by measuring nuclear magnetic resonance signal Sig1 generated from this imaging voxel V1 and performing one-dimensional Fourier transform of the measured nuclear magnetic resonance signal, it becomes possible to obtain the magnetic resonance spectrum of the imaging voxel V1. In the preliminary measurement, the frequency of the radio frequency magnetic field for excitation of water used in the water signal suppressing pulse sequence is determined from the magnetic resonance spectrum obtained with the above pulse sequence. In the main measurement, this magnetic resonance spectrum is memorized in the memory part 30 (main measurement signal storage part 31) as spectrum information of the voxel V1 for integration.

The water signal suppression pulse sequence is executed immediately before the excitation and detection with the MRS sequence for the main measurement in order to prevent weak signals of metabolites from being buried in the foot of the huge signal peak generated from water, and thus becoming impossible to be separated and extracted for detection of the signals of metabolites. FIG. 6 (a) shows the water signal suppressing pulse sequence adopted in this embodiment, and FIG. 6 (b) shows a conventional water signal suppressing pulse sequence.

Although the pulse sequence shown in FIG. 6 (a) also attain pseudo saturation of water signal by a combination of a radio frequency magnetic field of narrow band for exciting nuclear magnetization only in water molecules and a magnetic field gradient for diffusing the phase like the conventional water signal suppressing pulse sequence shown in FIG. 6 (b), it is different in that it includes measurement of a signal Sig0 for monitoring frequency change after the irradiation of the radio frequency magnetic field and before the application of the magnetic field gradient.

That is, a radio frequency magnetic field RFw1, of which transmission frequency Ft is set to be the resonance frequency of water Fw and the excitation frequency band ΔFt is set to be around water peak width ΔFw, is irradiated first to selectively excite nuclear magnetization of water. As this resonance frequency Fw, the resonance frequency of water obtained from the spectrum obtained by the preliminary measurement is used. The flip angle of the radio frequency magnetic field RFw for excitation of water is usually set to be about 90°.

Subsequently, the signal Sig0 generated from water by irradiation of the radio frequency magnetic field RFw1 is measured and saved in the signal information storage part 33 of the memory part 30 (FIG. 4, step 409). This signal Sig0 is used for the determination of change of the radio frequency magnetic field described later.

Then, in order to disperse phases of the nuclear magnetization in a large number of water molecules in an excited state and to make the vectorial sum of magnetization zero, a dephasing magnetic field gradient Gdw1 is applied (pseudo saturation of nuclear magnetization of water). In order to enhance the water signal suppressing effect, application of radio frequency magnetic field and dephasing magnetic field gradient similar to the radio frequency magnetic field RFw1 for excitation of water and dephasing magnetic field gradient Gdw1 is further repeated. Although the drawing shows an example in which the application is repeated 3 times, number of the repetition times is not limited to 3 times. When the application is repeated two or more times, the signal Sig0 is obtained preferably, but not limited to, after the first excitation.

Further, although a magnetic field gradient of one axis among Gx, Gy and Gz is used as the dephasing magnetic field gradient applied after application of the radio frequency magnetic field in the example shown in FIG. 6, magnetic field gradients for all three axes of Gx, Gy and Gz may be simultaneously applied, or those for any two of the axes may be simultaneously applied. Various combinations and numerical values are used for the number of application axes and application intensity of the dephasing magnetic field gradients.

Further, by performing excitation of the voxel V1 and detection of the signal Sig1 from it with the sequence shown in FIG. 5 while the pseudo saturation of water magnetization continues, it becomes possible to measure weak signals of metabolites.

Since the signals measured as described above are extremely weak, the noise ratio (S/N) is improved by repeating the measurement many times. That is, the aforementioned water signal suppressing pulse sequence and MRS pulse sequence are, as one set, repeated two or more times, and detected signals Sig1 are integrated. If the static magnetic field intensity is constant over time during many times of repetition of the measurement, the transmission frequency at the time of radio frequency magnetic field irradiation and the reception frequency at the time of magnetic resonance signal detection may be those determined once at the start of the measurement. However, if the static magnetic field intensity changes over time for some reasons, various problems arise accompanied with increase of the repetition times of measurement, for example, suppression rate for water may gradually fall, excited voxel position may gradually shift, and the S/N improvement effect by integration may not be sufficiently obtained.

In this embodiment, such change of the static magnetic field intensity over time and accompanying change of the resonance frequency of water are monitored by using the signals Sig0 measured with the water signal suppressing pulse sequence shown in FIG. 6 (a). The method therefor is shown in FIG. 7. The signal Sig0 is measured in every execution of the water signal suppressing pulse sequence, and it is saved in the signal information storage part 33 of the memory part 30. When static magnetic field intensity changes, and the resonance frequency of water shifts from the excitation band region ΔFw set in the water signal suppressing pulse sequence, nuclear magnetization in water molecules is not excited, and water signal intensity decreases. Therefore, when water signal strength decreases below a predetermined value, the change determination part 23 of the control part 20 determines that the resonance frequency has shifted, and sends a command to the sequence control part 21 to perform the preliminary measurement for detecting water resonance frequency (steps 403 to 406).

As the aforementioned predetermined value used in the change determination part 23, the absolute value of water signal strength may be specified, or a relative value based on a water signal strength obtained by the first measurement or the previous measurement may be used. This value is saved beforehand as a threshold value in the parameter-and-so-forth storage part 32 of the memory part 30. When the preliminary measurement is performed as a result of the determination by the change determination part 23, the resonance frequency of water detected by this preliminary measurement is used in the following repetitive measurement for determining the transmission frequency of the radio frequency magnetic field irradiated with the water signal suppressing pulse sequence, the transmission frequency of the radio frequency magnetic fields for excitation and inversion, and the reception frequency at the time of magnetic resonance signal detection in the MRS measurement sequence.

The signals obtained by the measurement repeated many times are finally integrated, and a spectrum is calculated by performing one-dimensional Fourier transform of the integrated signal. By performing such integration of a large number of signals, noise ratio (S/N) of the spectrum can be improved even for a signal of a metabolite of which signal detected from a living body is extremely weak.

According to this embodiment, by obtaining a nuclear magnetic resonance signal with a water signal suppressing pulse sequence executed prior to MRS measurement, and monitoring frequency change on the basis of the signal intensity, the transmission frequency and reception frequency of the radio frequency magnetic field can be changed in accordance with the frequency change. The problems of the decrease in the water suppression rate, shift of excited voxel position and so forth in the repetitive measurement can be thereby eliminated even when the static magnetic field is not constant over time. Moreover, since the signal for monitoring the frequency change can be measured by using a water signal suppressing pulse sequence in this embodiment, it does not need to perform preliminary measurement in order to monitor the frequency, and thus the measurement time can be shortened as the whole process. Further, since frequency change is determined on the basis of signal strength or change thereof, operations including Fourier transform are also unnecessary, and determination can be made immediately.

Although the embodiment mentioned above has been explained for the MRS measurement, it can also similarly be applied to MRSI. In the case of MRSI, for example, the MRSI pulse sequence shown in FIG. 8 can be used as a pulse sequence for the main measurement. Although this MRSI pulse sequence excites an imaging region determined beforehand by using 3 sets of magnetic field gradients for slice selection and radio frequency magnetic fields like the MRS pulse sequence shown in FIG. 5, it is different in that the first radio frequency magnetic field RF1 selects a broadband and imparts positional information by using a phase encoding magnetic field gradient. Namely, in the MRSI pulse sequence, phase encoding magnetic field gradients Gp1, Gp2 and Gp3, which can impart three-dimensional space information, are added after the third magnetic field gradient Gs3 for the third slice selection and the third radio frequency magnetic field RF3, and measurement of signal Sig1 is repeatedly performed with gradually changing application intensities of these magnetic field gradients Gp1, Gp2 and Gp3.

By executing the pulse sequence shown in FIG. 8, only the nuclear magnetization in the region (image pick-up region) R1, at which the aforementioned three slices cross, can be selectively excited. Further, if the application intensities of the phase encoding magnetic field gradients, Gp1, Gp2 and Gp3, are changed in Mx steps for the X-axis direction, in My steps for the Y-axis direction, and in Mz steps for the Z-axis direction, magnetic resonance spectra generated from voxels in a number of Mx×My×Mz can be obtained by performing 4-dimensional Fourier transform of the measured magnetic resonance signals in a number of Mx×My×Mz.

Also in this case, the water signal suppressing pulse sequence shown in FIG. 6 (a) is executed immediately before the MRSI pulse sequence, i.e., the main measurement, and a nuclear magnetic resonance signal Sig0 is obtained after application of the radio frequency magnetic field RFw1 for excitation of water and before application of the dephasing magnetic field gradient Gdw1, and memorized in the memory part 30 (signal information storage part 33). Whenever the pulse sequence is repeatedly executed with changing the phase encoding magnetic field gradient, measurement of nuclear magnetic resonance signal Sig0 is also repeated, and the signal intensity thereof is monitored. And when the signal intensity becomes lower than the preliminarily determined threshold value or change of signal strength becomes larger than a preliminarily determined threshold value, the preliminary measurement is performed to obtain the resonance frequency of water, and the transmission frequency and reception frequency of the water signal suppressing pulse sequence and the radio frequency magnetic field used in the main measurement are determined on the basis of the resonance frequency of water. Since it is sufficient to obtain a spectrum in the preliminary measurement, the preliminary measurement can be performed with the MRS pulse sequence shown in FIG. 5.

This embodiment can also solve the problems such as decrease in the water suppression rate and a positional shift of excited voxel position during repetitive measurement, even when the static magnetic field is not constant over time, and also makes it possible to eliminate the problem peculiar to an MRSI sequence, i.e., the problem that impartation of positional information by phase encoding cannot be correctly performed.

The pulse sequences shown in FIGS. 5 and 8 are examples of MRS and MRSI sequences, respectively, and similar effect of the present invention can be obtained with an MRS or MRSI sequence other than those shown in FIGS. 5 and 8.

Description of Numerical Symbols

Figure 1:
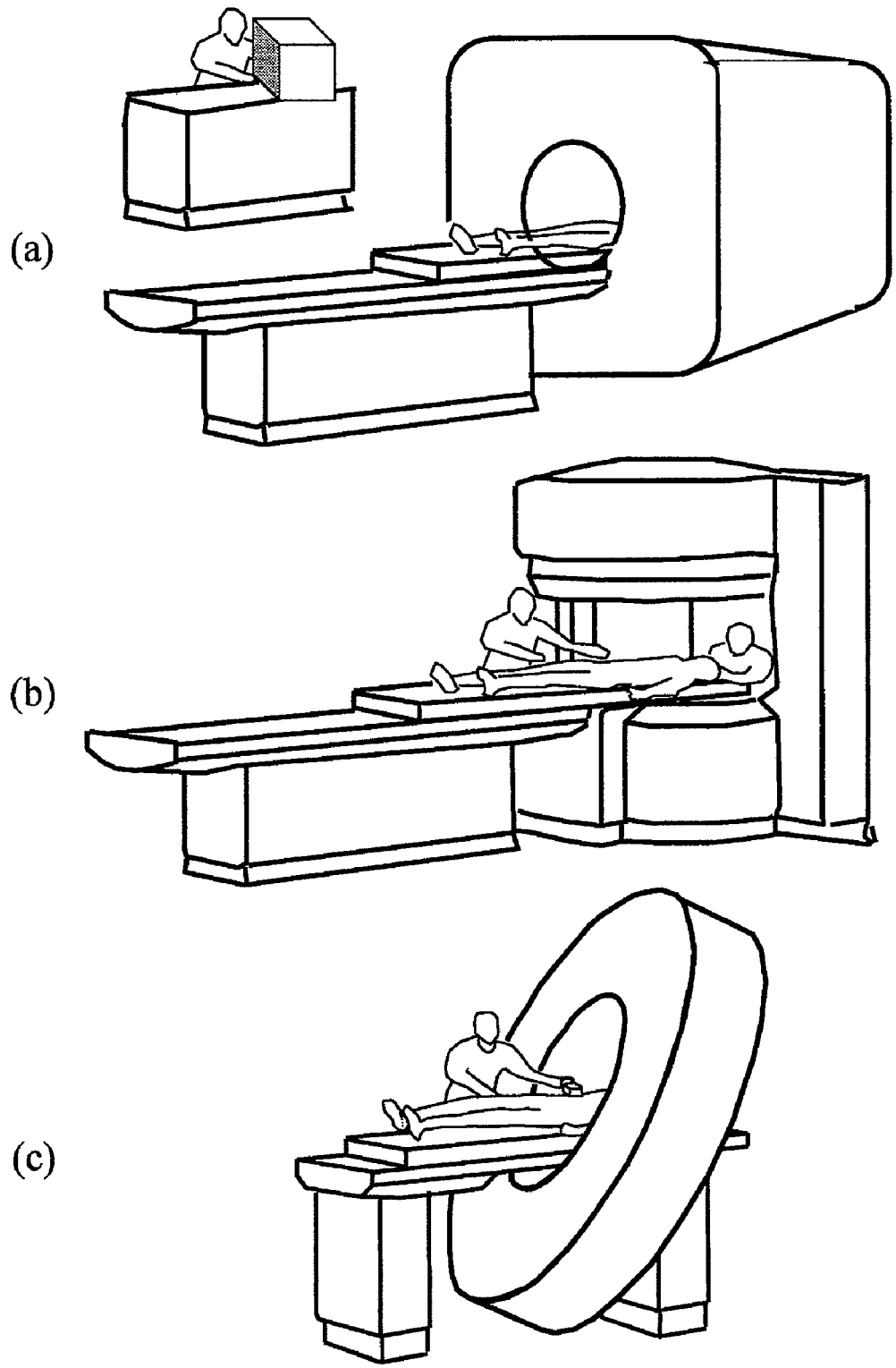
[FIG. 1] Exterior views of magnetic resonance imaging apparatuses to which the present invention is applied.
Figure 2:
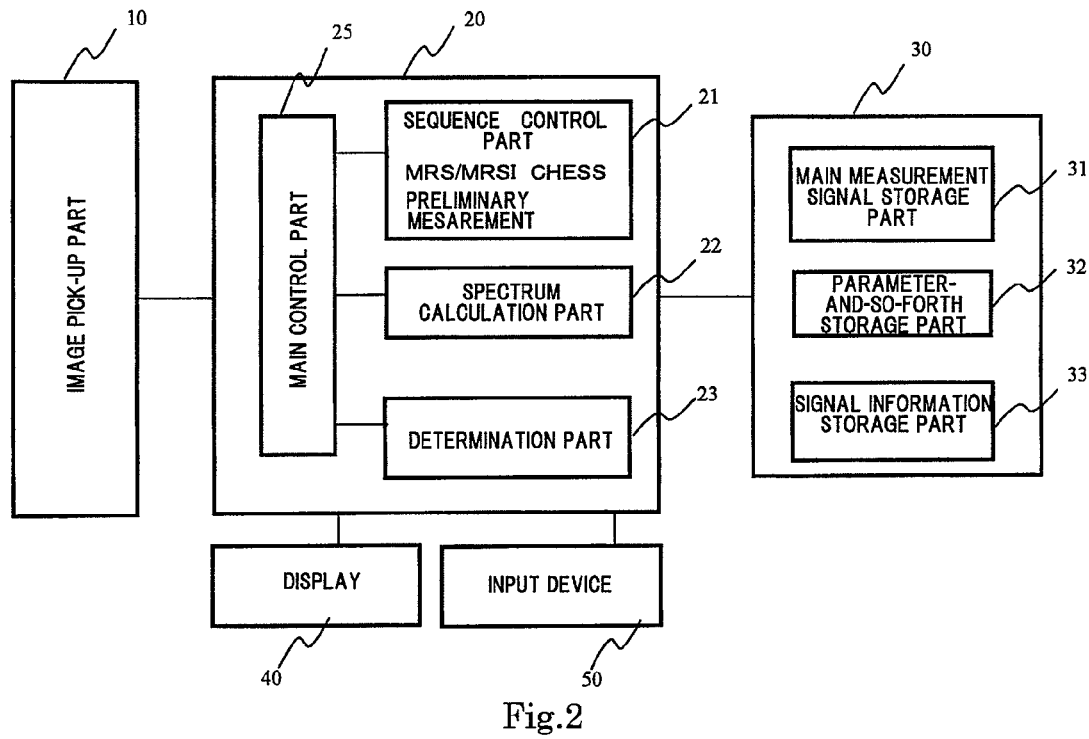
[FIG. 2] A block diagram showing an embodiment of the magnetic resonance imaging apparatus of the present invention.
Figure 3:
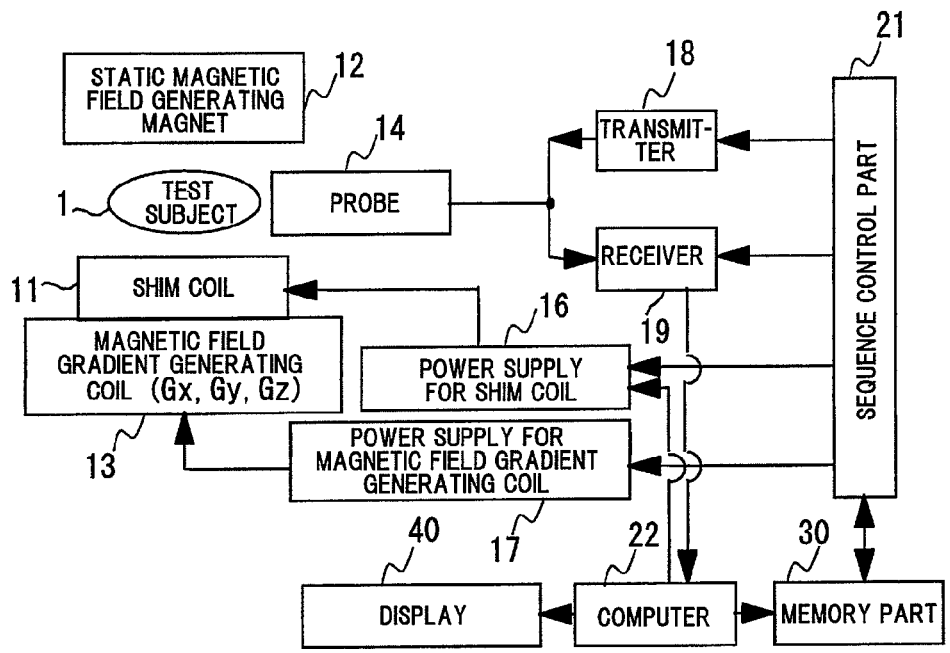
[FIG. 3] A drawing showing an overall configuration of the magnetic resonance imaging apparatus of the present invention.
Figure 4:
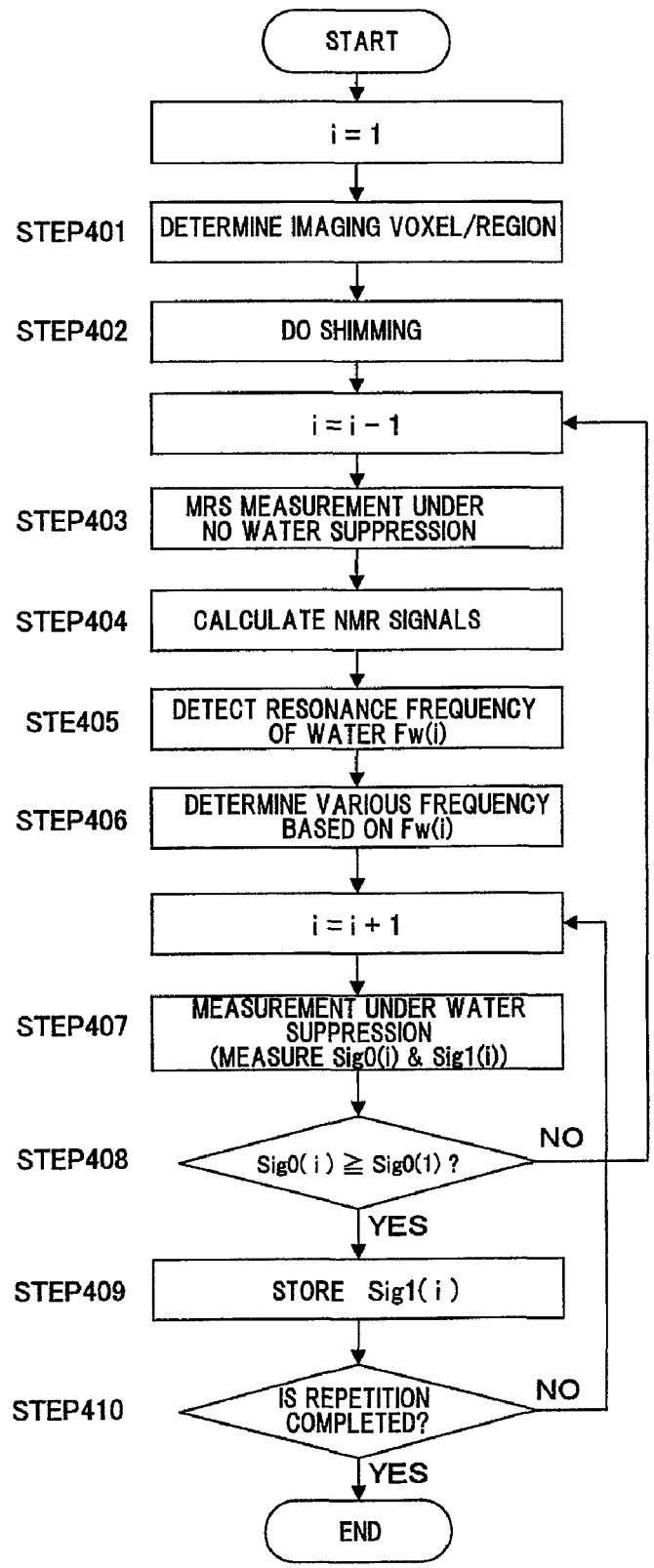
[FIG. 4] A flowchart showing an embodiment of operation of the magnetic resonance imaging apparatus of the present invention.
Figure 5:
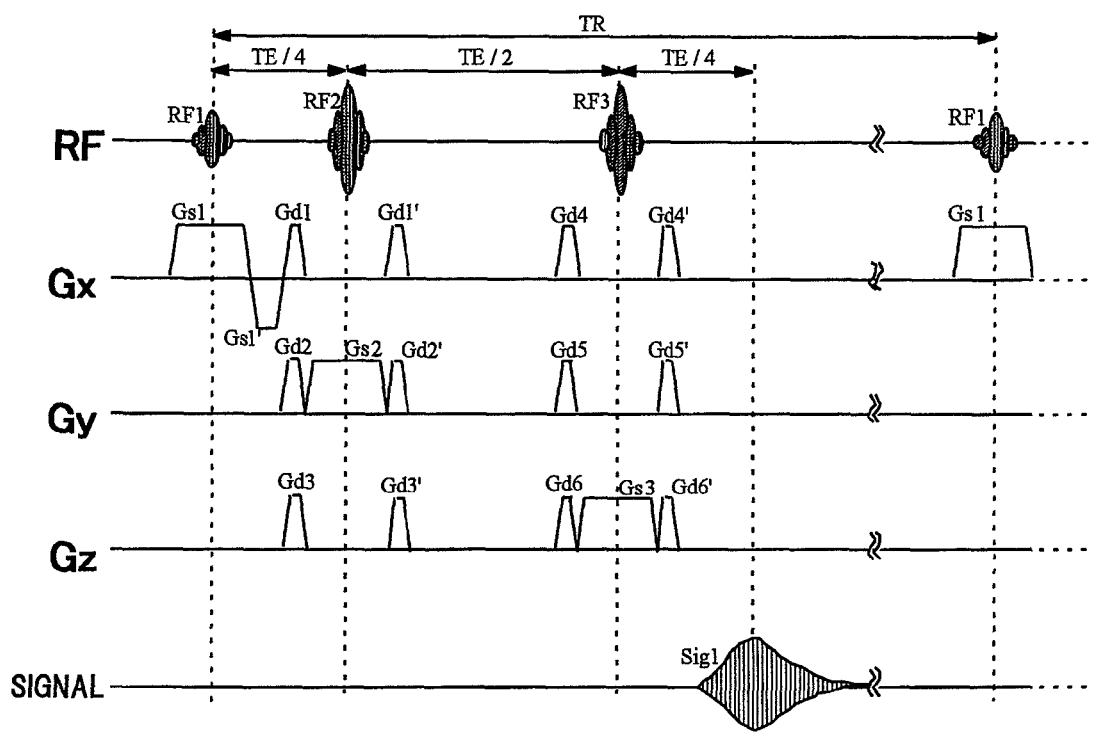
[FIG. 5] A drawing showing an example of MRS pulse sequence used in an embodiment of the present invention.
Figure 6:
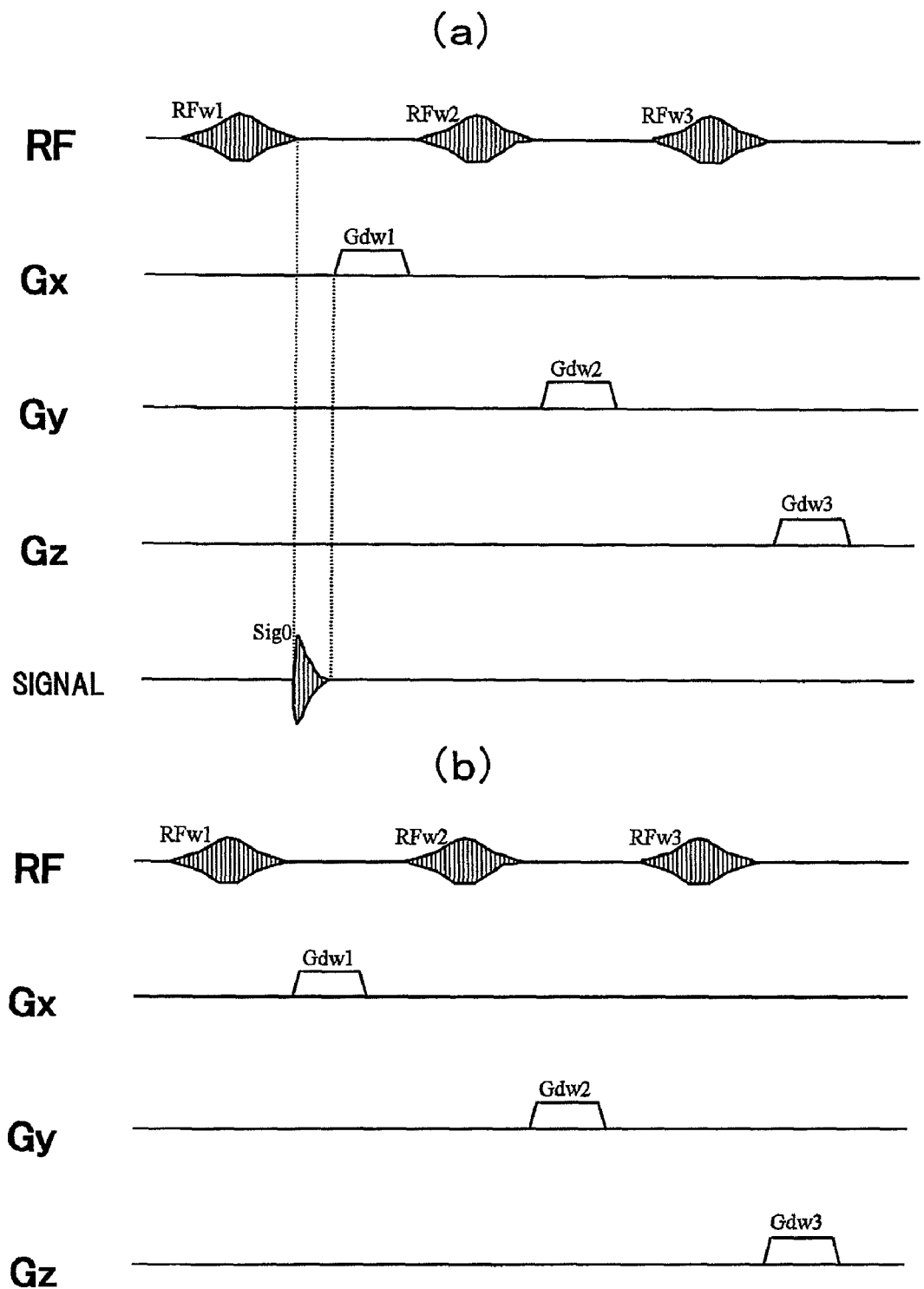
[FIG. 6] (a) A drawing showing an example of water signal suppressing pulse sequence used in an embodiment of the present invention, and (b) a drawing showing a conventional water signal suppressing pulse sequence.
Figure 7:
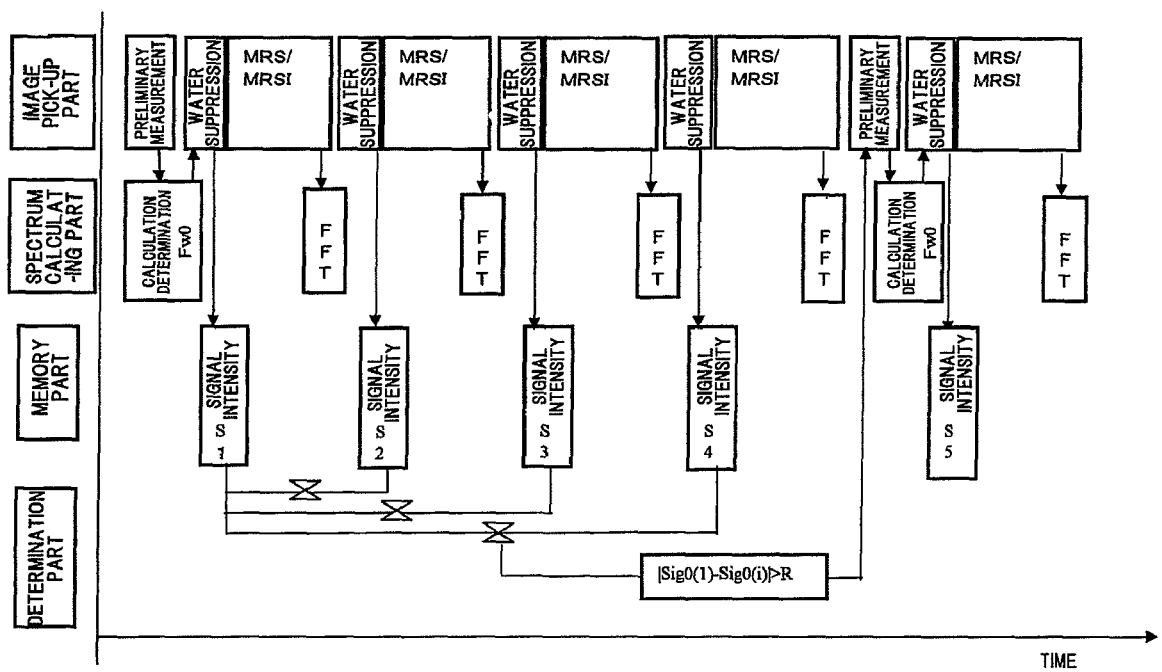
[FIG. 7] A drawing showing types of processing performed by elements of the magnetic resonance imaging apparatus of the present invention.
Figure 8:
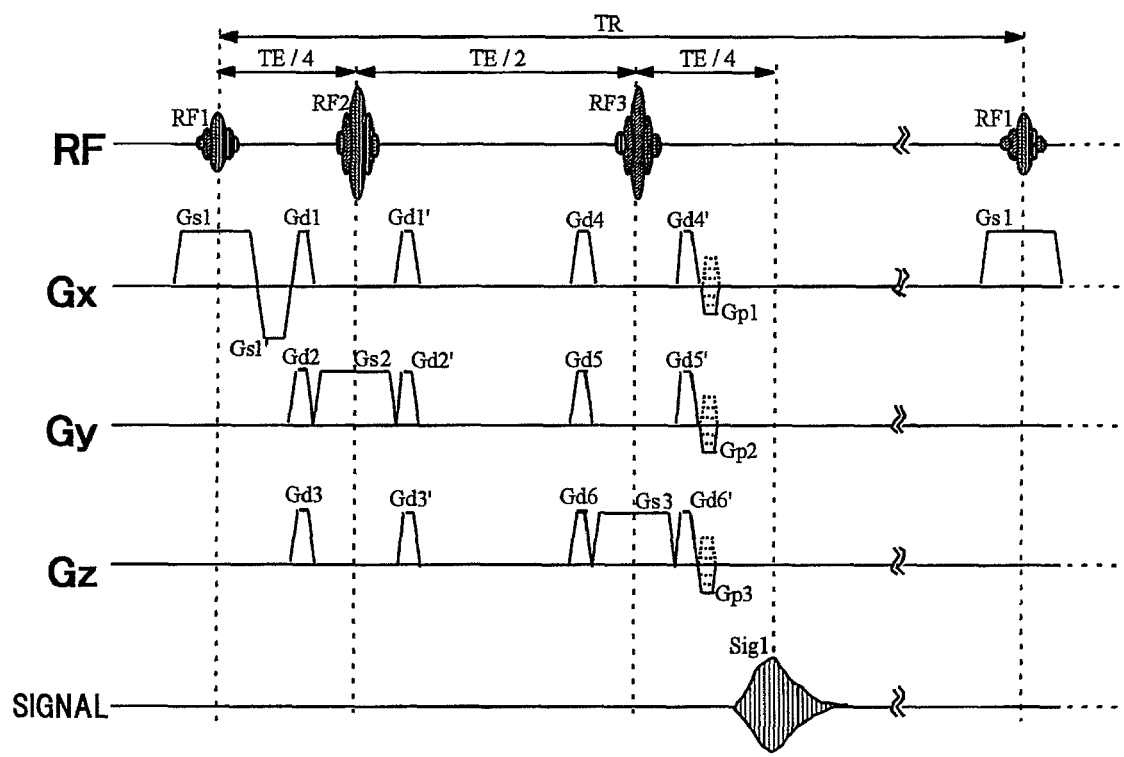
[FIG. 8] A drawing showing an example of MRSI pulse sequence used in an embodiment of the present invention.

1 . . . Test subject, 12 . . . static magnetic field generating magnet, 13 . . . magnetic field gradient generating coil, 14 . . . probe, 17 . . . power supplying part for magnetic field gradient, 18 . . . transmitter, 19 . . . receiver, 20 . . . control part, 21 . . . sequence control part, 22 . . . spectrum calculation part (computer), 23 . . . change determination part, 30 . . . memory part, 31 . . . spectrum information storage part, 32 . . . parameter-and-so-forth storage part, 33 . . . signal information storage part, 40 . . . display, 50 . . . input part.

The invention claimed is:

1. A magnetic resonance imaging apparatus comprising:
    a static magnetic field magnet which generates a static magnetic field,
    a magnetic field gradient generating means which generates a magnetic field gradient,
    a radio frequency magnetic field generating means which generates a radio frequency magnetic field,
    a receiving means which receives nuclear magnetic resonance signals generated by a subject,
    a control means which controls the magnetic field gradient generating means, the radio frequency magnetic field generating means and the receiving means, and
    a means which calculates a spectrum of an imaging region of the subject by using the nuclear magnetic resonance signals, wherein:
    the control means includes at least one first pulse sequence for applying a radio frequency magnetic field of a first frequency for suppressing magnetization of a specific substance contained in the imaging region, and a second pulse sequence for applying a radio frequency magnetic field of a second frequency following the first pulse sequence to obtain nuclear magnetic resonance signals from the imaging region, performs control for obtaining the nuclear magnetic resonance signals after application of the radio frequency magnetic field of the first frequency with the first pulse sequence, and
    the magnetic resonance imaging apparatus further comprising a determination means utilizing a water signal suppression pulse sequence for determining change of the first frequency by using information of the nuclear magnetic resonance signals obtained with the first pulse sequence, wherein the determination means determines that there is change when intensity of the nuclear magnetic resonance signals is lower than a preliminarily determined threshold value.

2. The magnetic resonance imaging apparatus according to claim 1, wherein:
    the control means controls the first frequency on the basis of result of determination performed by the determination means.

3. The magnetic resonance imaging apparatus according to claim 1, wherein:
    the apparatus comprises a memory means which memorizes information of the nuclear magnetic resonance signals obtained with the first pulse sequence, and
    the control means repeatedly executes the first pulse sequence and the second pulse sequence, and saves information of the nuclear magnetic resonance signals obtained with the first pulse sequence in the memory means for every repetition.

4. The magnetic resonance imaging apparatus according to any one of claims 1 to 3, wherein:
    the determination means determines that there is change when change of intensity of the nuclear magnetic resonance signals is larger than a preliminarily determined threshold value.

5. The magnetic resonance imaging apparatus according to claim 1, wherein:
    the first pulse sequence includes application of the radio frequency magnetic field of the first frequency and subsequent application of a dephasing magnetic field gradient, and the nuclear magnetic resonance signals are obtained between the application of the radio frequency magnetic field and the application of the magnetic field gradient.

6. The magnetic resonance imaging apparatus according to claim 5, wherein:
    the first pulse sequence includes multiple times of repetition of the application of the radio frequency magnetic field and the subsequent application of the dephasing magnetic field gradient, and the nuclear magnetic resonance signals are obtained immediately after the first application of the radio frequency magnetic field.

7. The magnetic resonance imaging apparatus according to claim 1, wherein:
    the control means includes a third pulse sequence for measuring a spectrum for determining the first frequency, and
    the third pulse sequence is executed when the determination means determines that there is change of the frequency.

8. The magnetic resonance imaging apparatus according to claim 7, wherein:
    the control means comprises a means for determining the first frequency on the basis of the spectrum measured with the third pulse sequence, and setting frequencies of the radio frequency magnetic fields of the first and second pulse sequences executed after the third pulse sequence on the basis of the determined first frequency.

9. The magnetic resonance imaging apparatus according to claim 1, wherein:
    the second pulse sequence includes at least one application of the radio frequency magnetic field of the second frequency and application of a phase encoding magnetic field gradient, and is repeated with changing the phase encoding magnetic field gradient.

10. The magnetic resonance imaging apparatus according to claim 1, wherein:
    the second pulse sequence includes at least three applications of the radio frequency magnetic field of the second frequency and application of a slice selection magnetic field gradient for each application of the radio frequency magnetic field with a different slice direction, so that nuclear magnetic resonance signals are measured for a region at which the three different slice directions cross.

11. A magnetic resonance imaging apparatus comprising:
    a static magnetic field magnet which generates a static magnetic field,
    a magnetic field gradient generating means which generates a magnetic field gradient,
    a radio frequency magnetic field generating means which generates a radio frequency magnetic field,
    a receiving means which receives nuclear magnetic resonance signals generated by a subject,
    a control means which controls the magnetic field gradient generating means, the radio frequency magnetic field generating means and the receiving means, and
    a means which calculates a spectrum of an imaging area of the subject by using the nuclear magnetic resonance signals, wherein:
    the control means includes at least one first pulse sequence for applying a radio frequency magnetic field of a first frequency for suppressing magnetization of a specific substance contained in the imaging region, performs control for obtaining the nuclear magnetic resonance signals after application of the radio frequency magnetic field of the first frequency with the first pulse sequence, and
    utilizes a water signal suppression pulse sequence for determining change of the first frequency by using intensity or change of intensity of the nuclear magnetic resonance signals, wherein the determining determines that there is change when intensity of the nuclear magnetic resonance signals is lower than a preliminarily determined threshold value.

12. An information processing method using nuclear magnetic resonance signals obtained by executing at least one first pulse sequence for applying a radio frequency magnetic field of a first frequency for suppressing magnetization of a specific substance contained in an imaging area of a subject and a second pulse sequence for applying a radio frequency magnetic field of a second frequency following the application of the first pulse sequence to obtain nuclear magnetic resonance signals from the imaging area, wherein:

the nuclear magnetic resonance signals are obtained after the application of the radio frequency magnetic field of the first frequency with the first pulse sequence, and change of the first frequency is determined by using a water signal suppression pulse sequence and information of the nuclear magnetic resonance signals obtained with the first pulse sequence, wherein the change is determined when intensity of the nuclear magnetic resonance signals is lower than a preliminarily determined threshold value.

13. The information processing method according to claim 12, wherein:

the first frequency used for the first pulse sequence is controlled by using determination result obtained by determining change of the first frequency.

* * * * *